United States Patent [19]

Shikama et al.

[11] Patent Number: 4,987,566

[45] Date of Patent: * Jan. 22, 1991

[54] OPTICAL HEAD APPARATUS

[75] Inventors: Shinsuke Shikama; Eiichi Toide; Mitsushige Kondou, all of Nagaokakyo; Kazuo Iwata, Gunma, all of Japan

[73] Assignee: Mitsubishi Denki Kabushiki Kaisha, Tokyo, Japan

[ * ] Notice: The portion of the term of this patent subsequent to Dec. 19, 2006 has been disclaimed.

[21] Appl. No.: 341,649

[22] Filed: Apr. 21, 1989

Related U.S. Application Data

[63] Continuation of Ser. No. 159,412, Feb. 12, 1988, Pat. No. 4,888,760, which is a continuation of Ser. No. 883,872, Jun. 9, 1986, abandoned.

[30] Foreign Application Priority Data

Jul. 29, 1985 [JP] Japan ................................ 60-167010
Jul. 29, 1985 [JP] Japan ................................ 60-167011

[51] Int. Cl.$^5$ ....................... G11B 7/00; H01L 39/02
[52] U.S. Cl. ...................... 369/122; 372/33; 372/36; 357/80
[58] Field of Search ................ 369/122; 372/36, 43, 372/33; 350/96.11; 357/80

[56] References Cited

U.S. PATENT DOCUMENTS

| 4,488,304 | 12/1984 | Shimiyu et al. | 372/36 |
| 4,794,607 | 12/1988 | Devlin | 372/49 |

FOREIGN PATENT DOCUMENTS

| 57-56984 | 4/1982 | Japan | 372/36 |
| 86334 | 4/1982 | Japan | 350/96.11 |
| 58-70592 | 4/1983 | Japan | 372/36 |
| 58-77273 | 5/1983 | Japan | 372/36 |
| 58-207689 | 12/1983 | Japan | 372/36 |
| 60-103316 | 6/1985 | Japan | 350/96.11 |
| 61-1077 | 1/1986 | Japan | 372/33 |

Primary Examiner—Aristotelis M. Psitos
Attorney, Agent, or Firm—Flynn, Thiel, Boutell & Tanis

[57] ABSTRACT

In case that the light beam emitted from a light source mounted on a base element is focused to a spot light on a data storage media to write the data, when the light beam reflected from the data storage media to return to the light source is reflected from the base element and focused again on the data storage media, it becomes difficult to precisely read/write the data on the storage media. In order to resolve the above problem, a light beam treating means is provided in the base element to prevent the re-incident light beams from being reflected toward the data storage media and focused thereon.

6 Claims, 7 Drawing Sheets

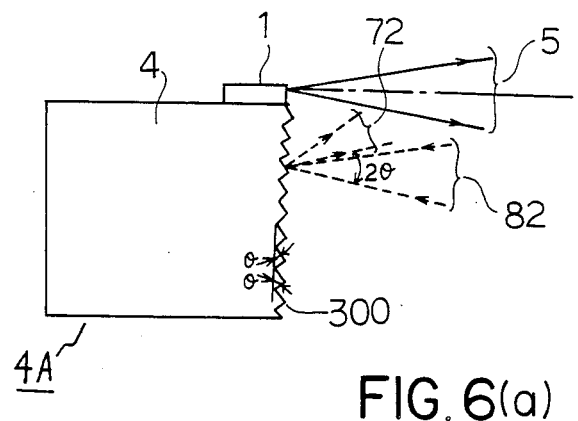
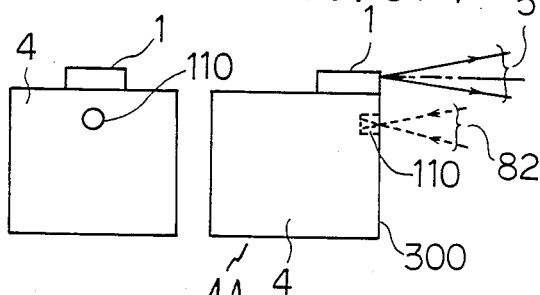
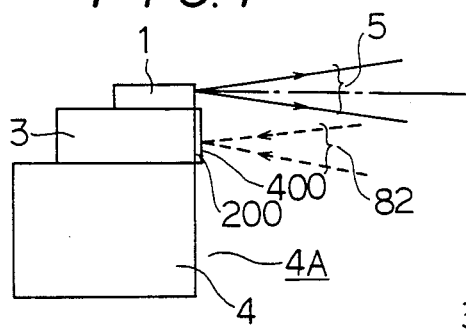
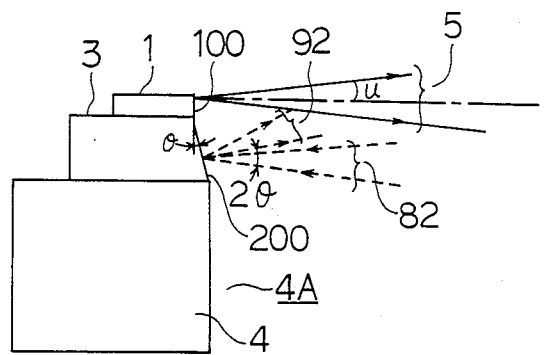

FIG. 15 PRIOR ART
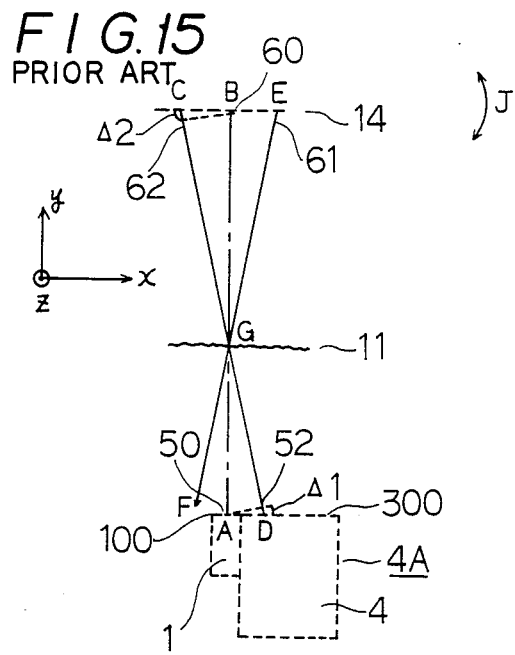
FIG. 16 (a) non DISK-INCLINATION CASE
PRIOR ART
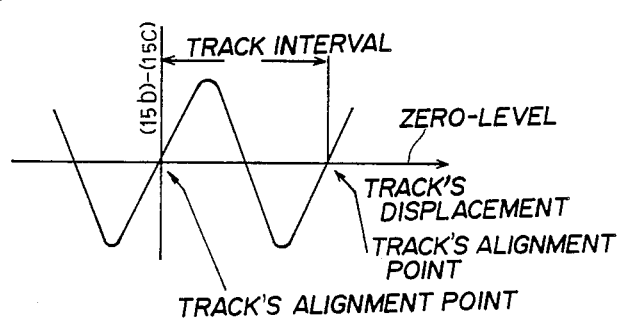
FIG. 16 (b) DISK-INCLINATION CASE
PRIOR ART
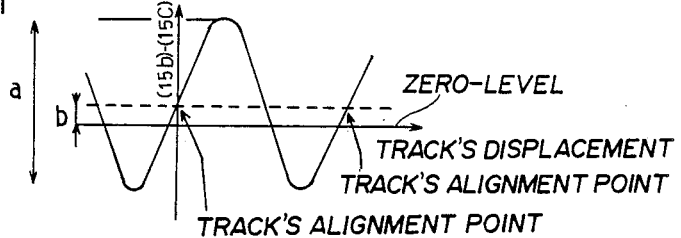

OPTICAL HEAD APPARATUS

This is a continuation of Ser. No. 07/159,412, now U.S. Pat. No. 4,888,760 filed Feb. 12, 1988, which is a continuation of Ser. No. 06/883,872 filed Jun. 9, 1986 now abandoned.

BACKGROUND OF THE INVENTION

1. Field of the Invention

The present invention relates to an optical head apparatus in which data may be stored on and read from an optical storage media, and more particularly to an improvement of an optical system thereof in its detection characteristics, which system employs a so-called twin-spot method as a track displacement detection technique for scanning data tracks of such optical storage media.

2. Description of the Prior Art

A conventional optical head apparatus is shown in FIGS. 13 (a), 13 (b) and 13 (c), in which: the reference numeral 1 denotes a semiconductor laser chip (LD chip serving as a light source; 5 an emitting light of the LD chip 1; 11 diffraction grating; 12 a beam splitter serving as a splitting means of the light; 13 an objective lens; 14 an optical disk constituting an optical data storage media with which the data may be optically stored and read from; 15 a photodetector for receiving light beams reflected from the optical disk 14; and 64 data-tracks on the optical disk 14. An incident light processing means is constructed of the diffraction grating 11 and the objective lens 13. FIG. 14 shows an enlarged view of a base element 4A constructed of a mount 4 for holding the LD chip 1. In FIG. 14, the reference numeral 1 denotes a semiconductor laser chip comprising, for example such as hetero junction of GaAs or GaAlAs, which chip 1 is fixed on the mount 4 constituting the base element 4A so that a front end face 100 of the chip 1 is made flush with a front end face 300 of the mount 4.

Now, the above conventional optical head apparatus will be hereinbelow described with reference to FIGS. 13(a), 13(b) and 13 (c).

A light beam 5 emitted from the LD chip 1 passes through a diffraction grating 11 to be divided in three beams as shown in dotted lines, which three divided beams are focused to three beam spot lights 60, 61 and 62 on the optical disk, respectively. Among them, the spot light 60 is produced by a zeroth order diffracted beam, while remaining two spot lights 61 and 62 of equal intensity are first order diffracted beams. As shown in FIG. 13 (a), the spot lights 60, 61 and 62 are so arranged that a straight line 63 connecting each of the centers of these spot lights 61, 60 and 62 in this order are slightly inclined with respect to a longitudinal direction of the track 64. These spot lights 60, 61 and 62 are reflected from the disk 14 and pass again through the objective lens 13, and thereafter are turned at right angles by means of the beam splitter 12 towards the photodetector 15. As shown in FIG. 13(b), the photodetector 15 is constructed of three photodetection elements of 15a, 15b and 15c serving as photodetection portions, of which the central photodetection element 15a receives the reflected beam of the zeroth order spot light 60 while the remaining photodetection elements 15b and 15c receive the reflected beams of the first order spot lights 62 and 61, respectively, so as to emit electric signals corresponding to the intensity of light detected. As is publicly known, the zeroth order spot light 60 is employed to read/write the data of the disk 14. When the data is read from the disk 14, output signals of the central photodetection element 15a is employed as disk data signals. As described in the above, since the first order spot lights 62 and 61 are arranged to be slightly inclined with respect to the track 64, the spot light 62 and 61 are not symmetrically reflected with each other when the disk 14 is displaced in a direction R perpendicular to the longitudinal direction of the track 64 as shown in FIG. 13 (c), so that the output signals of the photodetection elements 15b and 15c vary nonsymmetrically with each other. As a result, as is well known, it is possible to obtain S-shaped track displacement signals with respect to misalignment between the track 64 and the center of the spot light 60, from the variations of the output signals of the phtodetection elements 15b and 15c, which track displacement signals are employed as so-called tracking error signals of a tracking-servo system for compensating a position of the spot light 60 on the track 64 in order to precisely read/write the data, so that the spot light 60 is correctly positioned at a center of the track 64. The tracking-servo system mentioned above is not described herein in detail since the present invention does not relate thereto in essence.

Next, the LD chip 1 employed in the conventional optical head apparatus will be described in construction with reference to FIG. 14. The LD chip 1 is a device for emitting the laser beam 5 when electric current flows through its PN-junction plane 2 formed inside the LD chip 1. However, at this time, such current increases the temperature of the LD chip 1, which leads to the decrease of the output power of the laser beam 5. Consequently, in order to keep the output power of the laser beam 5 constant, it is necessary to increase the electric current supplied to the LD chip 1, as is well known. Such increase of the electric current exponentially shortens the service life of the LD chip 1. Hitherto, in order to facilitate heat removal of the LD chip 1, the same 1 is fixed to the mount 4 which has an extraordinary large volume relative to that of the LD chip 1 and made of good thermal conductive material such as silver and brass, so that the heat generated in the LD chip 1 is dispersed through the mount 4 to prevent the temperature of the LD chip 1 from increasing. Incidentally, the LD chip 1 is fixed to the mount 4 through relatively soft material such as gold solder and indium solder which prevents internal stresses from occuring in the LD chip 1. Typically, a thickness of the LD chip is within a range of about from 50 to 90 μm while that of the mount 4 is about 2000 μm. As shown in FIG. 14, the front end face 100 of the LD chip 1 and that 300 of the mount 4 are arranged in parallel to each other to facilitate their assembling.

In the conventional optical head apparatus having the above construction, the misalignment between the track 64 and the zeroth order spot light 60 is detected through differences in amount of light between the two first order spot lights 61 and 62 detected by the photodetector 15, and at this time, when the track 64 of the disk 14 is angularly displaced in either direction, the detection characteristics of the conventional apparatus varies in a direction J shown in FIG. 13 (a). This is a defect inherent in the conventional apparatus. On the other hand, when the LD chip 1 is displaced in the same direction J, the detection characteristics of the conventional apparatus varies as is in the above case. This is also a defect inherent in the conventional apparatus. These defects lead to a problem that the tracking error signals for correctly scanning the track 64 are not adequately detected.

The problem will be hereinbelow described in detail with reference to FIGS. 13(a), 13(b), 13(c) and 15.

As shown in FIG. 13 (a), 13(b) and 13(c), the three spot lights 60, 61 and 62, having been focused on the disk 14, are reflected, and then directed towards the photodetector 15 through the beam splitter 12 while parts of these spot lights 60, 61 and 62 pass again through the beam splitter 12 so as to return to the front end face 100 of the LD chip 1 through the diffraction grating 11 to be focused to three conjugate spot lights 50, 51 and 52 with respect to the spot lights 60, 61 and 62, respectively. At this time, typically, the spot lights 50, 51 and 52 are so arranged that they are spaced apart from each other at intervals of about 110 to 200 μm, so that there is no fear that the spot light 51, having returned to a position above the LD chip 1, is again reflected. In contrast with this, the central spot light 50 is again reflected from the beam emitting position of the LD chip 1, while the lower first order spot light 62 is again reflected from the front end face 300 of the mount 4, towards the disk 14. FIG. 15 is a partially enlarged view of the conventional apparatus shown in FIG. 13(a), in which the spot light 50 is one conjugate to the spot light 60 while the spot light 52 is one conjugate to the spot light 62. The lights having returned to the side of the LD chip 1 are again reflected from points "A" and D. FIG. 15 shows a case that the front end face 100 is parallel to the disk 14. In this case, strictly speaking, there is a difference Δ 1 in distance between the spot light 52 and the reflecting end face of the LD chip 1, while a difference Δ 2 between the spot light 62 and a light focusing point C as shown in FIG. 15. The original first order diffracted beams take light paths of AGC or AGE in FIG. 15, while the light having been reflected from the disk 14 and returned to the points "A" and D on the LD chip 1 as described above is, having been again reflected from the end face of the LD chip 1, again directed to the side of the disk 14. A light beam, having been reflected again, incident to the point C may take the following three light paths, provided that the first order diffraction of such incident beam takes place only one time:

a first beam 1' passing through a light path of AGBGAGC:

a second beam 2' passing through a light path of AGBGDGC; and a third beam 3' passing through a light path of AGCGDGC. A light beam, which will be reflected again from the front end face 100 of the LD chip 1 toward a point E of the disk 14, may take the following only one light path since there is no reflection from the side of a point F shown in FIG. 15:

a fourth beam 4' passing through a light path of AGBGAGE. Now, in case that the disk 14 or both the LD chip 1 and the mount 4 are inclined in the direction J as shown in FIG. 15, a coherence length of the LD chip 1 is not so large that interference takes place between the beam passing through a light path of AGC, which becomes directly the first order diffracted beam, and the above first 1', second 2' and third 3' beams, and further between the beam passing through a light path of AGE and the above fourth beam 4'. In contrast with this, interference takes place among the beams 1', 2' and 3' which are incident again on the point C. In brief, as shown in FIG. 15, tghe differences in length of the light paths are: 2Δ1 between the beams 1' 2'; 2Δ2 between the beams 2' and 3'; and 2Δ1+2Δ2 between the beams 3' and 1', so that a variation of Δ2 is produced when the disk 14 is finely angularly displaced in the direction J while a variation of Δ1 is produced when the LD chip 1 is finely angularly displaced in the same direction J, whereby the above three differences in length of the light paths vary to produce phase differences among these light beams 1', 2' and 3' so that the intensity of the spot light on the point C of the disk 14 is varied by interference among these beams when the disk 14 or the LD chip 1 is rotatably driven. On the other hand, in the side of the point E of the disk 14, since the beam 4' is only one beam to be again reflected toward the point E, there is no interference in contrast with the side of the point C described above. The spot lights 61 and 62, having been produced by the beams diffracted through the diffraction grating 11, are equal in intensity to each other as already described in the above. Consequently, in FIG. 13, in case that there is no interference and that alignment between the center of the central spot light 60 and that of the track 64 is precisely established, the spot lights 61 and 62 are arranged on the track 64 with misalignment equal in amount and opposite in direction as shown in FIG. 13 (c), so that the resultant reflected beams from these spot light 61 and 62 are equal in intensity to each other, whereby the outputs of the photodetection elements 15b and 15c of the photodetector 15 are balanced against each other to go to zero. Under such condition, when the track 64 is displaced laterally, the difference between the outputs of the photodetection elements 15b and 15c varies to be plus or minus to make it possible to obtain a correct detection signal of the track's displacement, a cycle of which detection signal corresponds to a track's interval as shown in FIG. 16(a) since the tracks 64 are arranged in cyclic manner while track's alignment points cross zero-level as shown in FIG. 16 (a). In contrast with this, in case that the above-mentioned interference is produced due to the inclination of the disk 14 so that the intensity of the light beam incident on, for example the photodetection element 15b becomes higher than that of the light beam incident on the photodetection element 15c, the detection signal of the track's displacement are so varied that the track's alignment points are spaced upward apart from the zero-level to the extent of "b" as shown in FIG. 16 (i), which deteriorates the detection characteristics of the conventional apparatus. In case that the LD chip 1 is inclined, the same deterioration occurs in the conventional apparatus.

In the conventional apparatus, for example, in case that: the spot lights' interval on the disk 14 is 22 μm and the spot lights' interval on the LD chip 1 is 110 μm, it is found by calculation that floating rate "b/a" (a half of the "a" is the amplitude of the detection signal of the track's displacement) of the track's alignment point varies in an 1· cycle with respect to the inclination of "θD" of the disk 14 as shown in FIG. 17(a). FIG. 17(b) shows a condition in which the LD chip 1 is finely inclined by 0.02· from the condition shown in FIG. 17(a), demonstrating that the rate "b/a" varies according to the inclination of the LD chip 1. The floating rate "b/a" varies in about a 0.02· cycle with respect to the inclination of the LD chip 1. In FIg. 15, in case that: reflectivity of the disk 14 is 80%; reflectivity of the front end face of the LD chip 1 is 30% (GaAs' reflectivity); reflectivity of the front end face of the mount 4 is 30%; diffraction rate of the zeroth order and the first order diffraction beams through the diffraction grating 11 is 5:1; and transmissivity of the beam splitter 12 is 50%, it is found by calculation that the floating rate "b/a" of the track's displacement reaches a maximum of about 26%, and this fact is confirmed from experiments. Consequently, due to such characteristics' variation, in the conventional apparatus, there is a fear that the detection characteristics of the track's alignment is considerably varied through the angular misalignment of the disk 14 occurred when the optical head apparatus is employed in the optical disk system and also through the angular misalignment of the LD chip 1 which may occur with age, to make it difficult to precisely read/write the data by the use of the conventional optical head apparatus.

As shown in FIGS. 18 to 20, it is also proposed to mount a buffer layer 3 on the mount 4 to construct the base element 4A so that the LD chip 1 is fixed to the buffer layer 3 of the base element 4A. The buffer layer 3 is employed for the following reason: namely, in case that the LD chip 1 is directly fixed to the mount 4, a large internal stress is produced in the LD chip 1 under the influence of heat generated in the chip 1 when the chip 1 is driven since the LD chip 1 and the mount 4 are considerably different in thermal expansion rate with each other. It is well known that such large internal stress of the LD chip 1 shortens the service life of the chip 1. In order to resolve this problem, the buffer layer 3 made of material provided with a thermal expansion rate similar to that of the LD chip 1, for example such as silicon is mounted on the mount 4 to construct the base element 4A on which the LD chip is mounted.

In such construction of the LD chip 1 and the buffer layer 36, the problems similar to those in the case shown in FIGS. 13 to 17 also occur as follows: namely, as shown in FIGS. 18 to 20, when the LD chip 1 is fixed to the mount 4 through the buffer layer 3 so that each of front end faces 100, 200 and 300 of the chip 1, the buffer layer 3 and the mount 4 are made parallel to each other, as shown in FIGS. 18(a), 18(b) and 18(c) the three spot lights 60, 61 and 62, having been focused on the disk 14, are reflected, and then directed towards the photodetector 15 through the beam splitter 12 while parts of these spot lights 60, 61 and 62 pass again through the beam splitter 12 so as to return to the front end face 100 of the LD chip 1 through the diffraction grating 11 to be focused to three conjugate spot lights 50, 51 and 52 with respect to the spot lights 60, 61 and 62, respectively. At this time, typically, the spot lights 50, 51 and 52 are so arranged that they are spaced apart from each other at intervals of about 110 to 200 $\mu$m, so that there is no fear that the spot light 51, having returned to a position above the LD chip 1, is again reflected. In contrast with this, the central spot light 50 is again reflected from the beam emitting position of the LD chip 1, while the lower first order spot light 62 is again reflected from the front end face 200 of the buffer layer 3, towards the disk 14. FIG. 20 is a partially enlarged view of the conventional apparatus shown in FIG. 18(a), in which the spot light 50 is one conjugate to the spot light 60 while the spot light 52 is one conjugate to the spot light 62. The lights having returned to the side of the LD chip 1 are again reflected from points "A" and D. FIG. 20 shows a case that the front end face 100 is parallel to the disk 14. In this case, strictly speaking, there is a difference $\Delta 1$ in distance between the spot light 52 and the reflecting end face of the buffer layer 3, while a difference $\Delta 2$ between the spot light 62 and a light focusing point C as shown in FIG. 20. The original first order diffracted beams take light paths of AGC or AGE in FIG. 20, while the light having been reflected from the disk 14 and returned to the points "A" and D on the LD chip 1 as described above is, having been again reflected from the end face of the LD chip 1 and buffer layer 3, respectively, again directed to the side of the disk 14. A light beam, having been reflected again, incident to the point C may take the following three light paths, provided that the first order diffraction of such incident beam takes place only onetime: diffraction of such incident beam takes place only onetime:

a first beam 1' passing through a light path of AGB-GAGC:

a second beam 2' passing through a light path of AGBGDGC; and a third beam 3' passing through a light path of AGCGDGC. A light beam, which will be reflected again from the front end face 100 of the LD chip 1 toward a point E of the disk 14, may take the following only one light path since there is no reflection from the side of a point F shown in FIG. 15:

a fourth beam 4' passing through a light path of AGB-GAGE. Now, in case that the disk 14 or the LD chip 1 and the buffer layer 3 are inclined in the direction J as shown in FIG. 20, a coherence length of the LD chip 1 is not so large that interference takes place between the beam passing through a light path of AGC, which becomes directly the first order diffracted beam, and the above first 1; second 2' and third 3' beams, and further between the beam passing through a light path of AGE and the above fourth beam 4'. In contrast with this, interference takes place among the beams 1', 2' and 3' which are incident again on the point C. In brief, as shown in FIG. 20, the differences in length of the light paths are: $2\Delta 1$ between the beams 1' and 2'; $2\Delta 2$ between the beams 2' and 3'; and $2\Delta 1 + 2\Delta 2$ between the beams 3' and 1', so that a variation of $\Delta 2$ is produced when the disk 14 is finely angularly displaced in the direction J while a variation of $\Delta 1$ is produced when the LD chip 1 is finely angularly displaced in the same direction J, whereby the above three differences in length of the light paths vary to produce phase differences among these light beams 1', 2' and 3' so that the intensity of the spot light on the point C of the disk 14 is varied by interference among these beams when the disk 14 or the LD chip 1 is rotatably driven. On the other hand, in the side of the point E of the disk 14, since the beam 4' is only one beam to be again reflected toward the point E, there is no interference in contrast with the side of the point C described above. The spot lights 61 and 62, having been produced by the beams diffracted through the diffraction grating 11, are equal in intensity to each other as already described in the above. Consequently, in FIG. 18, in case that there is no interference and that alignment between the center of the central spot light 60 and that of the track 64 is precisely established, the spot lights 61 and 62 are arranged on the track 64 with misalignment equal in amount and opposite in direction as shown in FIG. 18(c), so that the resultant reflected beams from these spot lights 61 and 62 are equal in intensity to each other. whereby the outputs of the photodetection elements 15b and 15c of the photodetector 15 are balanced against each other to go to zero. Under such condition, when the track 64 is displaced laterally, the difference between the outputs of the photodetection elements 15b and 15c varies to be plus or minus to make it possible to obtain a correct detection signal of the track's displacement, a cycle of which detection signal corresponds to a track's interval as shown in FIG. 16(a) since the tracks 64 are arranged in cyclic manner while track's alignment points cross zero-level as shown in FIG. 16(a). In contrast with this, in case that the above-mentioned interference is produced due to the inclination of the disk 14 so that the intensity of the light beam incident on, for example the photodetection element 15b becomes higher than that of the light beam incident on the photodetection element 15c, the detection signal of the track's displacement are so varied that the track's alignment points are spaced upward apart from the zero-level to the extent of "b" as shown in FIG. 16(b), which deteriorates the detection characteristics of the conventional apparatus. In case that the LD chip 1 is inclined, the same deterioration occurs in the conventional apparatus.

In the conventional apparatus, for example, in case that: the spot lights' interval on the disk 14 is 22μm and the spot lights' interval on the LD chip 1 is 110 μm, it is found by calculation that floating rate "b/a" (a half of the "a" is the amplitude of the detection signal of the track's displacement) of the track's alignment point varies in an 1· cycle with respect to the inclination of "$\theta D$" of the disk 14 as shown in FIG. 17(a). FIG. 17(b) shows a condition in which the LD chip 1 is finely inclined by 0.02· from the condition shown in FIG. 17(a), demonstrating that the rate "b/a" varies according to the inclination of the LD chip 1. The floating rate "b/a" varies in about 0.2· cycle with respect to the inclination of the LD chip 1. In FIG. 20, in case that: reflectivity of the disk 14 is 80% reflectivity of the front end face of the LD chip 1 is 30% (GaAs' reflectivity); reflectivity of the front end face of the buffer layer 3 is 30% (Si's reflectivity; diffraction rate of the zeroth order and first order diffracted beams through the diffraction grating 11 is 5:1; and transmissivity of the beam splitter 12 is 50%, it is found by calculation that the floating rate "b/a" of the of the track's displacement reaches a maximum of about 26%, and this fact is confirmed from experiments. Consequently, due to such characteristics' variation, in the conventional apparatus, there is a fear that the detection characteristics of the track's alignment is considerably varied through the angular misalignment of the disk 14 occured when the optical head apparatus is employed in the optical disk system and also through the angular misalignment of the LD chip 1 which may occur with age, to make it difficult to precisely read/write the data by the use of the conventional optical head apparatus.

SUMMARY OF THE INVENTION

It is a first object of the present invention to provide an optical head apparatus in which the light having returned to the mount and the buffer layer is prevented from being focused again to the spot light on the data storage media so as to precisely read/write the data.

It is a second object of the present invention to provide an optical system for the optical head apparatus in which the track's alignment point is prevented from floating apart from the zero-level of the operative output of the photodetector for detecting the two first order diffracted lights so as to precisely detect the track's displacement.

Other objects and advantages of the present invention will be clarified from the following description of the present invention with reference to the annexed drawings.

BRIEF DESCRIPTION OF THE DRAWINGS

FIG. 5 is a schematic view of the LD chip employed in the fifth embodiment of the present invention, showing the construction of the LD chip;

FIG. 6 is a schematic view of the LD chip employed in the sixth embodiment of the present invention, showing the construction of the LD chip;

FIG. 7 is a schematic view of the LD chip employed in the seventh embodiment of the present invention, showing the construction of the LD chip;

FIG. 8 is a schematic view of the LD chip employed in the eighth embodiment of the present invention, showing the construction of the LD chip;

FIG. 15 is a schematic view of the light paths of the 1st order light beams in the conventional optical head apparatus, describing the interference of the 1st order lights on the disk, which interference is a subject matter of the present invention to be resolved;

FIGS. 16 (a) and 16 (b) are views for describing the track's displacement detection outputs with regard to the track's displacement in both cases in that the disk's inclination exists and that the same is not exist, in comparison with each other in the conventional apparatus;

DESCRIPTION OF THE PREFERRED EMBODIMENTS

Figure 1:
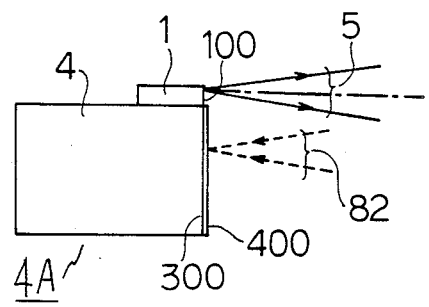
FIG. 1 is a schematic view of the LD chip employed in the first embodiment of the present invention, showing the construction of the LD chip.

Now, a first embodiment of the present invention will be hereinbelow described with reference to FIG. 1, in which parts similar to those of the conventional apparatus are denoted by the same reference numerals as those employed in the above description of the Prior Art so as to avoid the redundancy in description.

In an embodiment of the present invention, in addition to the construction of the conventional optical head apparatus, there is additionally provided an anti-reflection layer 400 serving as a light beam treating means in the front end face 300 of the mount 4 serving as the base element 4A. Owing to the provision of such anti-reflection layer 400, the first order returning light beam 82 is substantially prevented from reflecting from the front end face of the mount 4 even when incident thereon.

By such provision of the anti-reflection layer 400, it is possible to restrict the light beams, which are reflected again from the side of the LD chip 1 toward the point C of the disk 14, to only one beam passing through the light path of AGBGAGC, i.e., the first beam 1' described in the above description of the Prior Art. As described above, by reducing the reflectivity of the front end face of the mount 4, it is possible to restrict the light beams entering the first order light to only one beam, to make it possible to prevent the interference caused by differences in phase among a plurality of reincident beams due to the end face's inclination of the disk 14 and/or the LD chip 1, which interference is a defect inherent in the conventional optical head apparatus, whereby it is possible to eliminate the floating of the track's alignment point apart from the zero-level at a time when the track's displacement is detected by the use of the difference in the outputs of the photo-detection elements 15b and 15c of the photodetector 15. Now, the preparation of such anti-reflection layer 400 will be hereinbelow described with reference to some examples thereof. For example, the anti-reflection layer 400 may be constructed of a anti-reflection film formed according to optical film forming techniques. As is well known, for example from Junpei TSUJIUCHI, "Kogaku-Gairon II,"P. 54, issued from Asakura Shoten (1979), it is possible to obtain the following reflectivity: $R=((ns-n^2)/(ns+n^2))^2$ in case that a material having a refractive index n is deposited on another material having a refractive index of ns to the extent of a thickness $d=(2N+1)\cdot\lambda/4$ n, provided that N=0, 1, 2, ..., $\lambda$ denotes a wave length of the light.

In case that the mount 4 is made of silicon a refractive index Ms of which is Ms=3.4, the reflectivity of the mount 4 is $((ns-1)/(ns+1))^2 \approx 0.3$ when the mount 4 is not provided with any anti-reflection film. On the other hand, when the mount 4 is provided with an anti-reflection film of $CeF_3$ having a refractive index n=1.60 to the extent of a thickness $(2N+1)\cdot\lambda/4n=(2N+1)\cdot 0.125\mu m$, the reflectivity of the mount 4 with such anti-reflection film is 0.02, to make it possible to restrict the amount of the floating of the track's alignment point apart from the zero-level, to an amount 1/15 of that of the floating of the track's alignment point obtained in the conventional optical head apparatus, provided that $\lambda=0.8\mu m$.

The anti-reflection layer 400 may be easily constructed, for example, by painting the front end face 300 of the mount 4 with black ink for writing use. It is found that the reflectivity of silicon surface with such black ink painting can be kept at a value of about 3% through experiments. Consequently, it is possible to reduce the amount of the floating of the track's alignment detection output signals. In addition to such painting of the black ink, there are many materials which have reflectivities lower than that of the mount 4, which can improve the detection characteristic of the optical head apparatus when they are applied to the mount 4.

Figure 2:
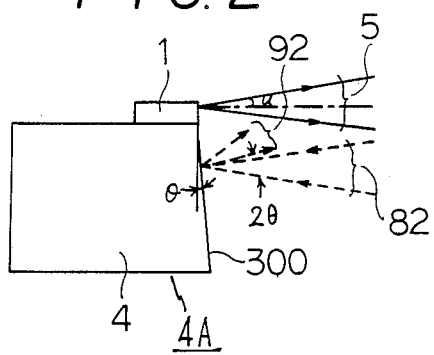
FIG. 2 is a schematic view of the LD chip employed in the second embodiment of the present invention, showing the construction of the LD chip.

FIG. 2 shows a second embodiment of the present invention, in which, in contrast with the conventional apparatus, the front end face 300 of the mount 4 is inclined by an angle of $\theta$ from a plane perpendicular to an optical axis of an optical condenser system of the optical head apparatus as shown in FIG. 2 in which the optical axis is shown in one-dotted chain line. Consequently, the first order light beam 82 having been reflected from the disk 14 toward the side of the LD chip 1 is reflected from the front end face 300 of the mount 4 in a direction deviated from the optical axis of such incident beam 82 by an angle of $2\theta$ to become a light beam 92 as shown in FIG. 2. Consequently, in case that a half angle of the light beam emitted from the LD chip 1 and to be focused is designated by the reference character u, when the angle of $\theta$ is larger than the half angle u, the thus reflected beam 92 does not pass through the light path of the incident beam 82 at all, to make it possible to prevent the reflected beam 92 from being focused on the disk 14 by the objective lens 13, so that the interference is prevented from occurring. It is naturally possible to decrease the amount of light of the beam 92 returning again to the position of the first order light beam on the disk 14 when the angle of $\theta$ is slightly smaller than the half angle u. Therefore, in this case, such provision of the oblique surface formed in the front end face 300 of the mount 4 is advantageous to reduce the influence of the interference.

Figure 3:
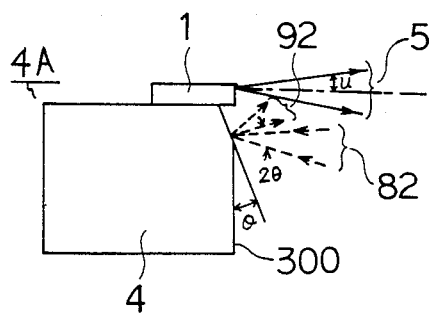
FIG. 3 is a schematic view of the LD chip employed in the third embodiment of the present invention, showing the construction of the LD chip.

FIG. 3 shows a third embodiment of the present invention, in which a portion of the front end face 300 of the mount 4 on which portion the light beam 82 to be incident on the side of the LD chip 1 is incident is chamfered, so that the reflected beam 92 is prevented from passing through the light path of the incident beam 82 as is in the case of the second embodiment of the present invention. By the use of the above construction, it is possible to reduce the influence of the interference as is in the case of the second embodiment of the present invention, and in case that $\theta > u$, it is possible to remove the interference.

Figure 4:
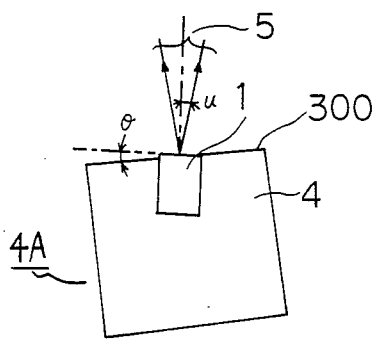
FIG. 4 is a schematic view of the LD chip employed in the fourth embodiment of the present invention, showing the construction of the LD chip.

FIG. 4 shows a fourth embodiment of the present invention, in which the front end face 300 of the mount 4 is inclined in horizontal plane by an angle of $\theta$ from a plane perpendicular to an optical axis of an optical condenser system of the optical head apparatus as shown in FIG. 4 in which the optical axis is shown in one dotted chain line. As is in the case of the second embodiment of the present invention, when $\theta > u$, it is also possible to separate the reflected light beam from the light beam incident on the mount 4, so that the interference is prevented from occurring. Even when $\theta > u$, it is also naturally possible to reduce the influence of the interference as is in the case of the second embodiment of the present invention. Namely, in any of the second, third and fourth embodiments of the present invention, the light beam treating means is constructed of the oblique surface formed in the portion of the front end face 300 of the mount 4 on which portion the light beam reflected from the disk 14 is incident, so that such incident light beam is prevented from being reflected again toward the disk 14.

FIG. 5 shows a fifth embodiment of the present invention, in which the light beam treating means is constructed of a serrated surface formed in the front end face 300 of the mount 4, which serrated surface comprises a plurality of small oblique faces each of which crosses a vertical plane at an angle of $\theta$ as shown in FIG. 5, so that, as is in the case of the second embodiment of the present invention, the light beam incident on the front end face 300 of the mount 4 is reflected in a direction deviated by an angle of $2\theta$ from the light path of such incident beam to make it possible to eliminate/reduce the interference.

FIG. 6 shows a sixth embodiment of the present invention, in which the light beam treating means is constructed of a hole 110 formed in a portion of the front end face 300 of the mount 4 on which portion the first order light beam 82 reflected from the disk 14 is incident. Due to the provision of this hole 110, the beam 82 cannot be focused on the front end face 300 of the mount 4 to make it hard that the beam 82 is reflected from such front end face 300 of the mount 4, so that the interferece is reduced in its influence.

Now, the present invention will be hereinbelow described as to a type of an embodiment in which the LD chip 1 is fixed on the base element 4A constructed in combination of the mount 4 and the buffer layer 3 mounted on the mount 4.

First, FIG. 7 shows a seventh embodiment of the present invention, in which, in addition to the conventional construction, an anti-reflection layer 400 serving as the light beam treating means is newly applied to a front end face 200 of the buffer layer 3. Due to the provision of this anti-reflection layer 400, the reflectivity of the entire front end face of the base element 4A is considerably reduced to make it possible to reduce/remove the influence of the interference.

The anti-reflection layer 400 may be easily formed by painting the front end face 200 of the buffer layer 3 with black ink for writing use. Through the experiments, it is found that the reflectivity of silicon's surface may be restricted to 3% owing to the provision of such black ink painting, to make it possible to reduce the amount of the floating of the track's alignment detection output signal so as to be 1/10 of that of the conventional apparatus. In addition to such painting of the black ink, there are many materials which have reflectivities lower than that of the mount 4, which can naturally improve the detection characteristics of the optical head apparatus when they are applied to the mount 4.

FIG. 8 shows an eighth embodiment of the present invention, in which, in contrast with the conventional apparatus, the front end face 200 of the buffer layer 3 is inclined in vertical plane by an angle of $\theta$ from a plane perpendicular to an optical axis of an optical condenser system of the optical head apparatus as shown in FIG. 8 in which the optical axis is shown in one-dotted chain line. Consequently, the first order light beam 82 having been reflected from the disk 14 toward the side of the LD chip 1 is reflected from the front end face 200 of the buffer 3 in a direction deviated from the optical axis of such incident beam 82 by an angle of $2\theta$ to become a light beam 92 as shown in FIG. 8.

Figure 9:
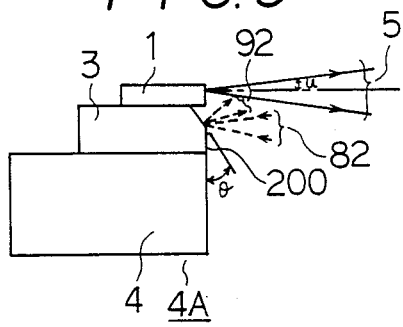
FIG. 9 is a schematic view of the LD chip employed in the ninth embodiment of the present invention, showing the construction of the LD chip.

FIG. 9 shows a ninth embodiment of the present invention, in which a portion of the front end face 200 of the buffer layer 3 on which portion the light beam 82 to be incident on the side of the LD chip 1 is incident is chamfered, so that the reflected beam 92 is prevented from passing through the light path of the incident beam 82 as is in the case of the eighth embodiment of the present invention. By the use of the above construction, it is possible to reduce the influence of the interference as is in the case of the eighth embodiment of the present invention, and in case that $\theta > u$, it is possible to remove the interference.

Figure 10:
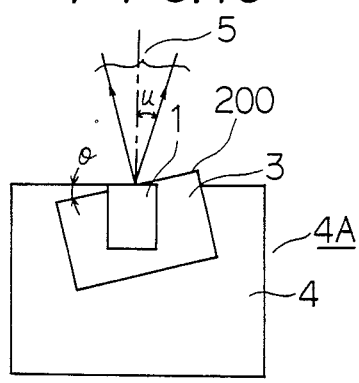
FIG. 10 is a schematic view of the LD chip employed in the tenth embodiment of the present invention, showing the construction of the LD chip.

FIG. 10 shows a tenth embodiment of the present invention, in which the front end face 200 of the buffer layer 3 is inclined in horizontal plane by an angle of $\theta$ from a plane perpendicular to an optical axis of an optical condenser system of the optical head apparatus as shown in one-dotted chain line. As is in the case of the eighth embodiment of the present invention, when $\theta > u$, it is also possible to separate the reflected light beam from the light beam incident on the buffer layer 3, so that the interference is prevented from occurring. Even when $\theta < u$, it is also possible to reduce the influence of the interference.

Figure 11:
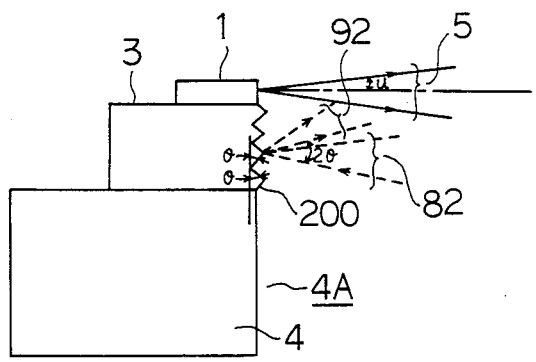
FIG. 11 is a schematic view of the LD chip employed in the eleventh embodiment of the present invention, showing the construction of the LD chip.

FIG. 11 shows an eleventh embodiment of the present invention, in which the light beam treating means is constructed of a serrated surface formed in the front end face 200 of the buffer layer 3, which serrated surface comprises a plurality of small oblique faces each of which crosses a vertical plane at an angle of $\theta$ as shown in FIG. 11, so that, as is in the case of the eighth embodiment of the present invention, the light beam incident on the front end face 200 of the buffer layer 3 is reflected in a direction deviated by an angle of $2\theta$ from the light path of such incident beam to make it possible to eliminate/reduce the interference.

Figure 12:
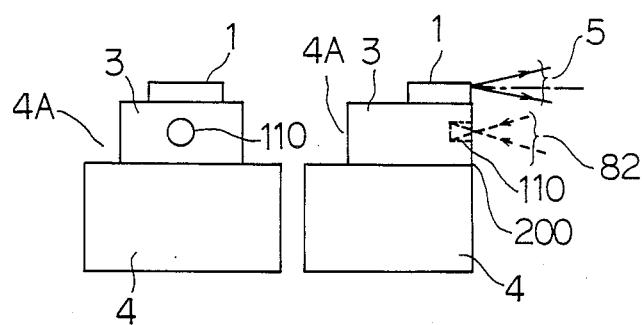
FIG. 12 is a schematic view of the LD chip employed in the twelfth embodiment of the present invention, showing the construction of the LD chip.
Figure 13A:
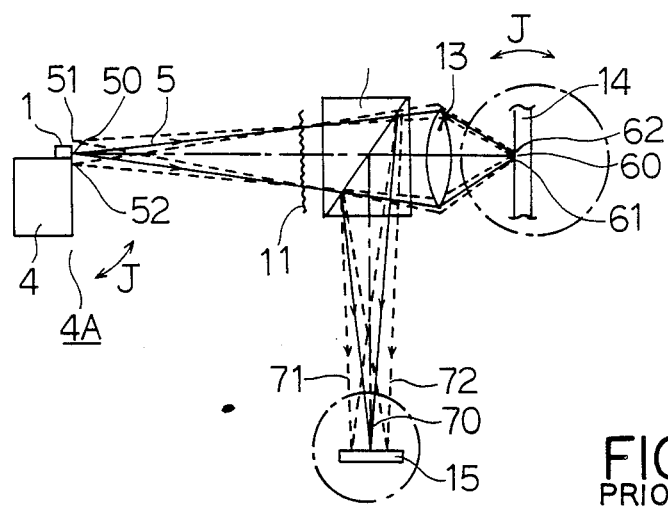
FIGS. 13 (a), 13 (b) and 13 (c) are schematic views of the conventional optical head apparatus.
Figure 13B:
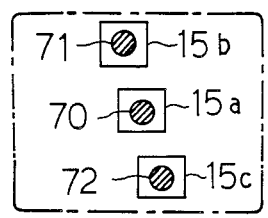
Figure 13C:
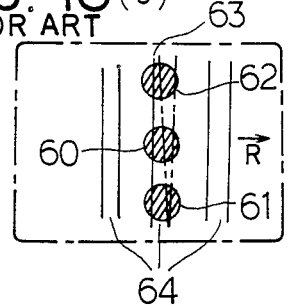
Figure 14:
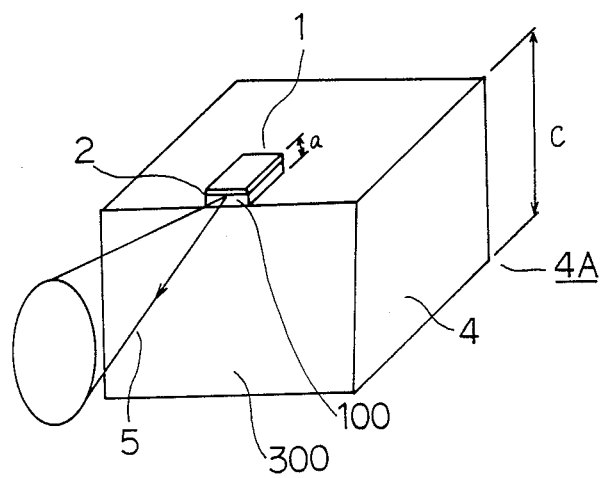
FIG. 14 is a perspective view of the LD chip employed in the conventional optical head apparatus, showing the construction of the LD chip.
Figure 18A:
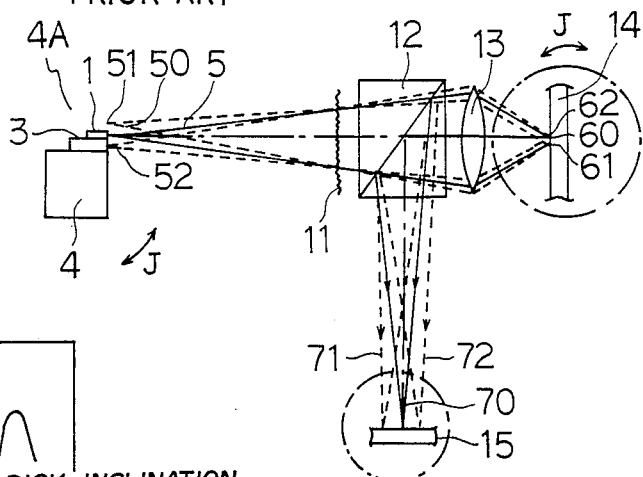
FIGS. 18 (a), 18 (b) and 18 (c) are schematic views of another conventional optical head apparatus in which the base element is constructed of the mount and the buffer layer.
Figure 17:
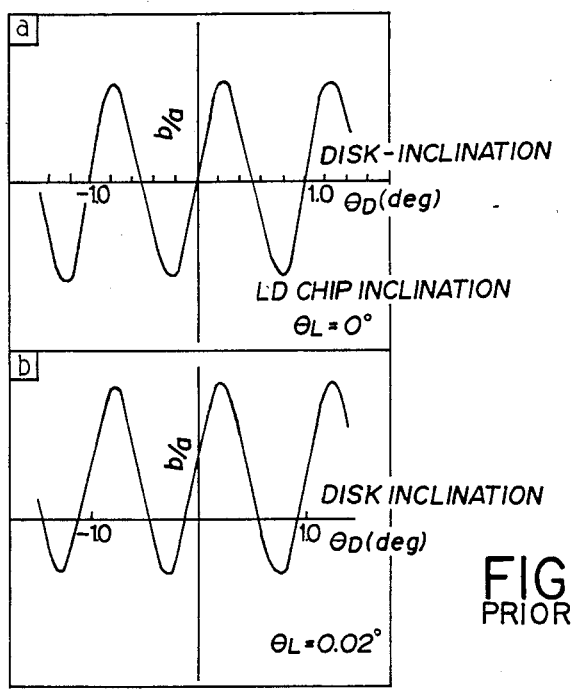
FIGS. 17 (a) and 17 (b) are schematic views for describing the variation of the detection output of the track's alignment point displacement relative to the disk's inclination in the conventional apparatus.
Figure 18B:
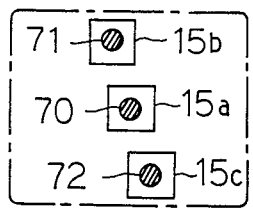
Figure 18C:
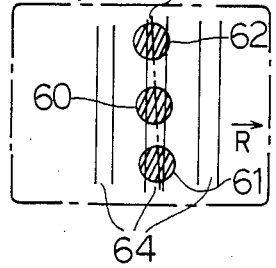
Figure 19:
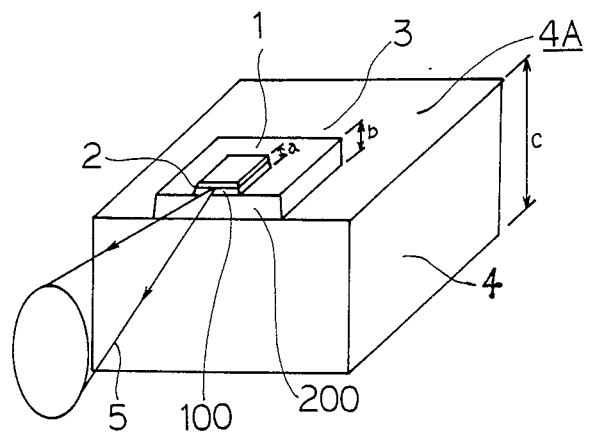
FIG. 19 is a perspective view of the LD chip employed in the another conventional optical head apparatus, showing the construction of the LD chip.
Figure 20:
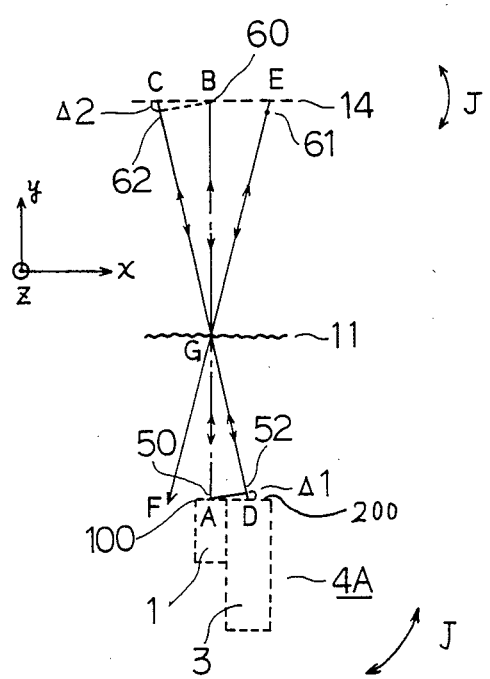
FIG. 20 is a schematic view of the light paths of the 1st order light beams in the another conventional optical head apparatus, describing the interference of the 1st order lights on the disk, which is the subject matter of the present invention to be resolved.

FIG. 12 is a twelfth embodiment of the present invention, in which the light beam treating means is constructed of a hole 110 formed in a portion of the front end face 200 of the buffer layer 3 on which portion the 1st order light beam 82 having been reflected from the disk 14 is incident. Due to such provision of the hole 110, the beam 82 can not be focused on the front end face 200 of the buffer layer 3 to make it difficult that the beam 82 is reflected from such front end face 200 of the buffer layer 3, so that the interference is reduced in its influence.

What is claimed is:

1. In an optical head apparatus having a light source with an optical axis mounted on a base element in a manner that a light emitting end face of said light source is oriented adjacent a front end face of said base element; optical incident means for diffracting a light beam emitted from said light source into a plurality of diffracted light beams and for focusing said diffracted light beams to a zeroth and first order spot light on a data storage media; splitter means interposed in said optical incident means for separating light beams coming from the side of said light source from reflected light beams coming from said data storage media; and photodetection means constructed of a plurality of photoreceptors for receiving light beams having been separated by said splitter means, the improvement comprising wherein a light beam treating means is provided adjacent said light source for preventing a reflecting of a re-incident light beam which is conjugate to the first order spot light on said data storage media from said optical incident means back to said optical incident means, said light beam treating means being provided on at least a portion of said base element, on which portion said re-incident light beam not having been separated by said splitter means would normally become incident again, and wherein said front end face of said base element is, inclined in a horizontal first plane, at an angle to a second plane perpendicular to said optical axis, said second plane being parallel to said light emitting end face of said light source.

2. In an optical head apparatus having a light source with an optical axis mounted on a base element in a manner that a light emitting end face of said light source is oriented adjacent a front end face of said base element; optical incident means for diffracting a light beam emitted from said light source into a plurality of diffracted light beams and for focusing said diffracted light beams to a zeroth and first order spot light on a data storage media; splitter means interposed in said optical incident means for separating light beams coming from the side of said light source from reflected light beams coming from said data storage media: and photodetection means constructed of a plurality of photoreceptors for receiving light beams having been separated by said splitter means, the improvement comprising wherein a light beam treating means is provided adjacent said light source for preventing a reflecting of a re-incident light beam which is conjugate to the first order spot light on said data storage media from said optical incident means back to said optical incident means, said light beam treating means being provided on at least a portion of said base element, on which portion said re-incident light beam not having been separated by said splitter means would normally become incident again, wherein said base element includes means defining a mount on which is mounted a buffer layer, said light source being mounted on said buffer layer, and wherein a front end face of said buffer layer is inclined, in a horizontal first plane, at an angle to a second plane perpendicular to said optical axis, said second plane being parallel to said light emitting end face of said light source.

3. In an optical head apparatus having a light source mounted on a base element in a manner that a light emitting end face of said light source is oriented adjacent a front end face of said base element; optical incident means for diffracting a light beam emitted from said light source into plurality of diffracted light beams and for focusing said diffracted light beams to a zeroth and first order spot light on a data storage media; splitter means interposed in said optical incident means for separating light beams coming from the side of said light source from reflected light beams coming from said data storage media; and photodetection means constructed of a plurality of photoreceptors for receiving light beams having been separated by said splitter means, the improvement comprising wherein said base element includes means defining a mount on which is mounted a buffer layer, said light source being mounted on said buffer layer, wherein a light beam treating means is provided adjacent said light source for preventing a reflecting of a re-incident light beam which is conjugate to the first order spot light on said data storage media from said optical incident means back to said optical incident means, said light beam treating means being provided on at least a portion of said buffer layer, on which portion said re-incident light beam not having been separated by said splitter means would normally become incident again.

4. In an optical head apparatus having a light source with an optical axis mounted on a base element in a manner that a light emitting end face of said light source is oriented adjacent a front end face of said base element; optical incident means for diffracting a light beam emitted from said light source into a plurality of diffracted light beams and for focusing said diffracted light beams to a zeroth and first order spot light on a data storage media; splitter means interposed in said optical incident means for separating light beams coming from said light source from reflected light beams coming from said data storage media and directing said reflected light beams in a direction transverse to said optical axis; and photodetection means constructed of a plurality of photoreceptors for receiving said reflected light beams that have been separated by said splitter means and directed in said direction transverse to said optical axis, the improvement comprising wherein a light beam treating means is provided adjacent said light source for preventing a reflecting of a re-incident light beam which is conjugate to the first order spot light on said data storage media from said optical incident means back to said optical incident means to thereby prevent said re-incident light beam from becoming incident again and to prevent, therefore, any such beams from being directed to said photodetection means, said light beam treating means being provided on at least a portion of said base element, on which portion said re-incident light beam not having been separated by said splitter means would normally become incident again.

5. The optical had apparatus as set forth in claim 4, wherein said light beam treating means includes means defining an anti-reflection layer coated on a front end face of said base element.

6. The optical head apparatus as set forth claim 4, wherein said light beam treating means includes means defining an oblique surface formed in said front end face of said base element for reflecting the incident light beams out of said optical incident means.

* * * * *

UNITED STATES PATENT AND TRADEMARK OFFICE
CERTIFICATE OF CORRECTION

PATENT NO. : 4 987 566
DATED : January 22, 1991
INVENTOR(S) : Shinsuke SHIKAMA et al.

It is certified that error appears in the above-identified patent and that said Letters Patent is hereby corrected as shown below:

On the title page, under item [63] entitled Related U.S. Application Data change "Jun. 9, 1986" to ---July 9, 1986---.

Column 13, line 18; change "media:" to ---media;---.
Column 13, line 43; after "into" insert ---a---.
Column 14, line 43; change "had" to ---head---.
Column 14, line 47; after "forth" insert ---in---.

Signed and Sealed this

Seventeenth Day of November, 1992

Attest:

DOUGLAS B. COMER

*Attesting Officer*     *Acting Commissioner of Patents and Trademarks*